(12) United States Patent
Ueda et al.

(10) Patent No.: US 6,656,281 B1
(45) Date of Patent: Dec. 2, 2003

(54) SUBSTRATE PROCESSING APPARATUS AND SUBSTRATE PROCESSING METHOD

(75) Inventors: Issei Ueda, Kumamoto (JP); Hiroyuki Kudou, Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 406 days.

(21) Appl. No.: 09/589,451

(22) Filed: Jun. 8, 2000

(30) Foreign Application Priority Data

Jun. 9, 1999 (JP) .......................................... 11-162565

(51) Int. Cl.$^7$ .............................................. B05C 11/00
(52) U.S. Cl. ...................... 118/695; 118/712; 118/50; 118/62; 118/63; 118/64
(58) Field of Search ............................... 118/692, 50, 64, 118/62, 63, 695, 708, 712; 134/902

(56) References Cited

U.S. PATENT DOCUMENTS 5,766,671 A  *  6/1998  Matsui ........................ 427/8
5,928,390 A      7/1999  Yaegashi et al.
6,357,143 B2 *  3/2002  Morad et al. .................. 34/412

FOREIGN PATENT DOCUMENTS

JP          363238281 A  * 10/1988  ................. 118/692

\* cited by examiner

*Primary Examiner*—Richard Crispino
*Assistant Examiner*—George R. Koch, III
(74) *Attorney, Agent, or Firm*—Oblon, Spivak, McClelland, Maier & Neustadt, P.C.

(57) ABSTRACT

A blast unit for sending air from the top of a processing chamber to the bottom thereof and an exhaust pipe for exhausting gas from the bottom of the processing chamber are provided. Concomitantly with a change in pressure in the processing chamber, intervals of a slit damper and/or the degree of opening of a damper is controlled by a controller and thus a blast amount or an exhaust amount is controlled, thereby maintaining the pressure in the processing chamber almost constant.

19 Claims, 10 Drawing Sheets

SUBSTRATE PROCESSING APPARATUS AND SUBSTRATE PROCESSING METHOD

CROSS-REFERENCE TO RELATED APPLICATIONS

This application is based upon and claims the benefit of priority from the prior Japanese Patent Application No. 11-162565, filed Jun. 9, 1999, the entire contents of which are incorporated herein by reference.

BACKGROUND OF THE INVENTION

The present invention relates to a substrate processing apparatus and method for performing processing such as developing processing or the like for a substrate such as a semiconductor wafer or the like while sending air in a processing chamber.

In a photolithography process of a semiconductor device, a semiconductor wafer is coated with a resist, a resist film formed by the coating process is exposed in accordance with a predetermined circuit pattern, and the exposed pattern is developed, whereby a circuit pattern is formed on the resist film.

To perform such a series of processes, hitherto a resist coating and developing processing system has been used. Such a resist coating and developing processing system includes a processing station, a cassette station and an interface section, which are integrally provided. Various processing units for performing various kinds of processing for coating and developing for a wafer are multi-tiered in the cassette station. The cassette station has cassettes for housing a plurality of semiconductor wafers, carrying the semiconductor wafers into the processing station one by one and carrying the processed semiconductor wafer out of the processing station and housing it in a cassette. The interface section receives and passes the wafer from and to an aligner disposed adjacent to the system, for exposing a resist film in a predetermined pattern.

In such a resist coating and developing processing system, wafers are taken out of the cassette placed in the cassette station one by one and transferred to the processing station. The wafer is first subjected to hydrophobic processing in an adhesion processing unit and cooled in a cooling processing unit, and thereafter coated with a photoresist film in a resist coating unit and subjected to baking processing in a heat processing unit.

Thereafter, the semiconductor wafer is transferred to the aligner from the processing station via the interface section, and the resist film is exposed in a predetermined pattern in the aligner. After exposure, the semiconductor wafer is transferred again to the processing station via the interface section. The exposed semiconductor wafer is first subjected to post-exposure bake processing in the heat processing unit and cooled, and thereafter coated with a developing solution in a developing processing unit, whereby the exposed pattern is developed. Then, the semiconductor wafer is subjected to post-bake processing in the heat processing unit and cooled, and thus a series of processing is completed. After the completion of the series of processing, the semiconductor wafer is transferred to the cassette station and housed in the wafer cassette.

In the developing unit which is a rotary system processing unit in the aforesaid coating and developing system, the wafer which has undergone the bake processing and cooling processing after being exposed is mounted on a spin chuck in a processing chamber, and a developing solution is supplied to the wafer and applied over the entire face of the wafer, for example, so as to have a thickness of 1 mm. The developing solution stands still for a predetermined period of time while being applied onto the wafer, and developing processing is progressed by natural convection. Thereafter, the wafer is rotated by the spin chuck, and thereby the developing solution is blown off. Thereafter, a rinse solution is discharged to wash away the developing solution remaining on the wafer. The spin chuck is then rotated at a high speed, thereby the developing solution and the rinse solution remaining on the wafer are blown away, and the wafer W is dried.

Incidentally, in such a developing process, clean air is sent into the processing chamber of the developing unit from the top thereof via a filter and exhausted from the bottom of the processing chamber, thus forming the down flow of clean air in the processing chamber. However, when the developing solution stands still for a predetermined period of time while being applied over the entire face of the wafer, exhaust operation is stopped in order to prevent a change in temperature, and the exhaust operation is resumed just before the standstill of the developing solution concludes. When the exhaust operation is stopped during the standstill of the developing solution as above, however, the pressure in the processing chamber of the developing unit rises.

In the case where the wafer is carried into the developing unit, when a wafer transfer device reaches the front of a shutter of the developing unit, the shutter is opened, and the wafer is delivered to the spin chuck by the wafer transfer device, but the pressure in the processing chamber of the developing unit drops when the shutter is opened.

Such a change in pressure is conventionally not so important to developing processing. In recent years, however, with high integration of devices, patterns become more minute, and developing units are downsized in terms of saving space, whereby there is a possibility that a change in pressure in the processing chamber as described above exerts an influence on developing processing.

BRIEF SUMMARY OF THE INVENTION

An object of the present invention is to provide a substrate processing apparatus and a substrate processing method capable of preventing a change in pressure in the processing chamber to the utmost and eliminating a bad influence on processing accompanying the change in pressure.

To settle the aforesaid disadvantage, according to a first aspect of the present invention, a substrate processing apparatus comprises a processing chamber configured to perform predetermined processing for a substrate therein, a blast unit configured to send gas into the processing chamber from the top toward the bottom thereof, an exhaust unit configured to perform exhaust operation from within the processing chamber through the bottom thereof, and a control unit configured to regulate a blast amount of the blast unit and/or an exhaust amount of the exhaust unit concomitantly with a change in pressure in the processing chamber to maintain the pressure in the processing chamber nearly constant.

According to the aforesaid structure, even when the pressure in the processing chamber is prone to change due to downsizing of the processing unit, the blast amount and/or the exhaust amount is regulated concomitantly with the change in pressure to thereby maintain the pressure in the processing chamber nearly constant. As a result, a change in pressure in the processing chamber can be prevented to the utmost, and an influence accompanying the change in pressure can be eliminated.

According to a second aspect of the present invention, a substrate processing apparatus comprises a processing chamber configured to perform predetermined processing for a substrate therein, a blast unit configured to send gas into the processing chamber from the top toward the bottom thereof, an exhaust unit configured to perform exhaust operation from within the processing chamber through the bottom thereof, a carrying in/out port configured to carry the substrate into the processing chamber and out of the processing chamber, a shutter configured to open and close the carrying in/out port, and a control unit configured to perform such control that a blast amount of the blast unit is increased or an exhaust amount of the exhaust unit is decreased concomitantly with the opening of the shutter when the shutter is opened to maintain pressure in the processing chamber nearly constant.

According to the aforesaid structure, even when the pressure in the processing chamber is prone to change with the opening and closing of the shutter for carrying the substrate to be processed in and out due to downsizing of the processing unit, such a control that the blast amount is increased or the exhaust amount is decreased concomitantly with the opening of the shutter when the shutter is opened is performed to thereby maintain the pressure in the processing chamber nearly constant. Consequently, a drop in pressure at the time of opening of the shutter can be compensated and a change in pressure in the processing chamber can be prevented to the utmost, thereby eliminating an influence accompanying the change in pressure.

According to a third aspect of the present invention, a substrate processing apparatus comprises a processing chamber configured to house a substrate, a processing solution supply mechanism configured to supply a processing solution to the substrate in the processing chamber, a blast unit configured to send gas into the processing chamber from the top toward the bottom thereof, an exhaust unit configured to perform exhaust operation from within the processing chamber through the bottom thereof, and a control unit configured to stop the exhaust operation of the exhaust unit during a predetermined period of time after the processing solution is supplied to the substrate and concomitantly with the stop of the exhaust operation and decrease a blast amount of the blast unit, thereby maintaining pressure in the processing chamber nearly constant.

According to the aforesaid structure, when solution processing using a processing solution is performed for the substrate, during a predetermined period of time after the processing solution is supplied to the substrate, the exhaust operation of the exhaust unit is stopped in order to prevent a change in temperature and the like, and even when a rise in pressure in the processing chamber arises due to the stop of the exhaust operation, since the blast amount of the blast unit is decreased concomitantly with the stop of the exhaust operation of the exhaust unit to thereby maintain the pressure in the processing chamber almost constant, the rise in pressure following the stop of the exhaust operation can be compensated, and a change in pressure in the processing chamber can be prevented to the utmost, thereby eliminating an influence accompanying the change in pressure.

According to a fourth aspect of the present invention, a substrate processing method for performing predetermined processing for a substrate in a processing chamber, comprises the steps of performing blast operation of sending gas into the processing chamber from the top toward the bottom thereof and performing exhaust operation from within the processing chamber through the bottom thereof, and during the blast and exhaust operation, controlling at least one of the blast operation and the exhaust operation concomitantly with a change in pressure in the processing chamber to maintain the pressure in the processing chamber nearly constant.

According to a fifth aspect of the present invention, a substrate processing method for performing predetermined processing for a substrate in a processing chamber, comprises the steps of performing blast operation of sending gas into the processing chamber from the top toward the bottom thereof and performing exhaust operation from within the processing chamber through the bottom thereof, during the blast and exhaust operation, opening a shutter for opening and closing a carrying in/out port for carrying the substrate in and out, and when the shutter is opened, concomitantly with the opening of the shutter, increasing a blast amount or decreasing an exhaust amount to maintain pressure in the processing chamber nearly constant.

According to a sixth aspect of the present invention, a substrate processing method for supplying a processing solution to a substrate to perform predetermined solution processing for the substrate while blast operation of sending gas into the processing chamber from the top toward the bottom thereof is performed with exhaust operation through the bottom thereof being performed, comprises the steps of stopping the exhaust operation during a predetermined period of time after the processing solution is supplied to the substrate, and concomitantly with the stop of the exhaust operation, decreasing a blast amount to maintain pressure in the processing chamber nearly constant.

According to the structures of the fourth to sixth aspects of the present invention, the same effects as the first to third aspects have can be obtained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Preferred embodiments of the present invention will be described in detail below with reference to the accompanying drawings.

Figure 1:
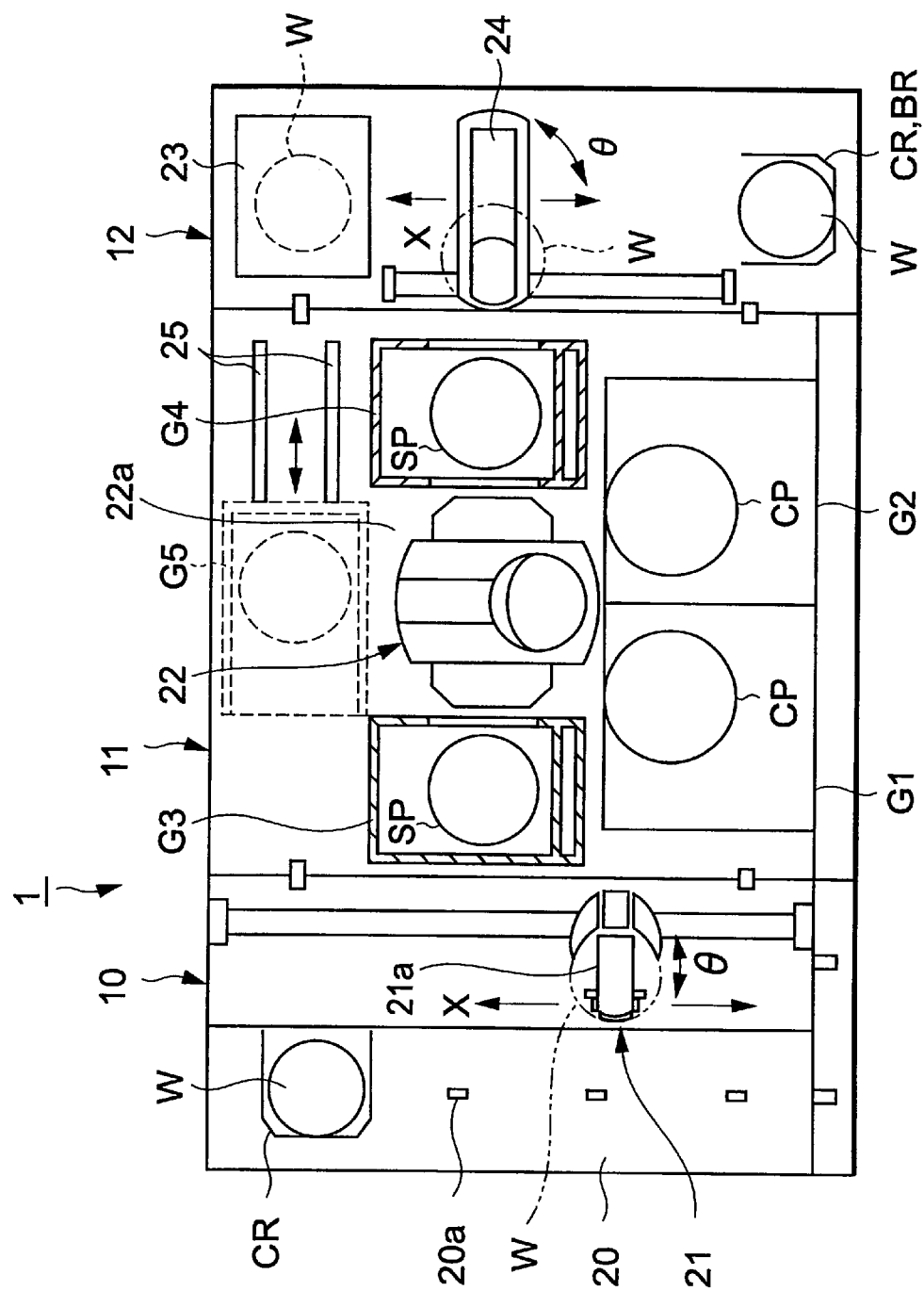
FIG. 1 is a plane view showing the entire structure of a resist coating and developing processing system for a semiconductor wafer according to an embodiment of the present invention.
Figure 2:
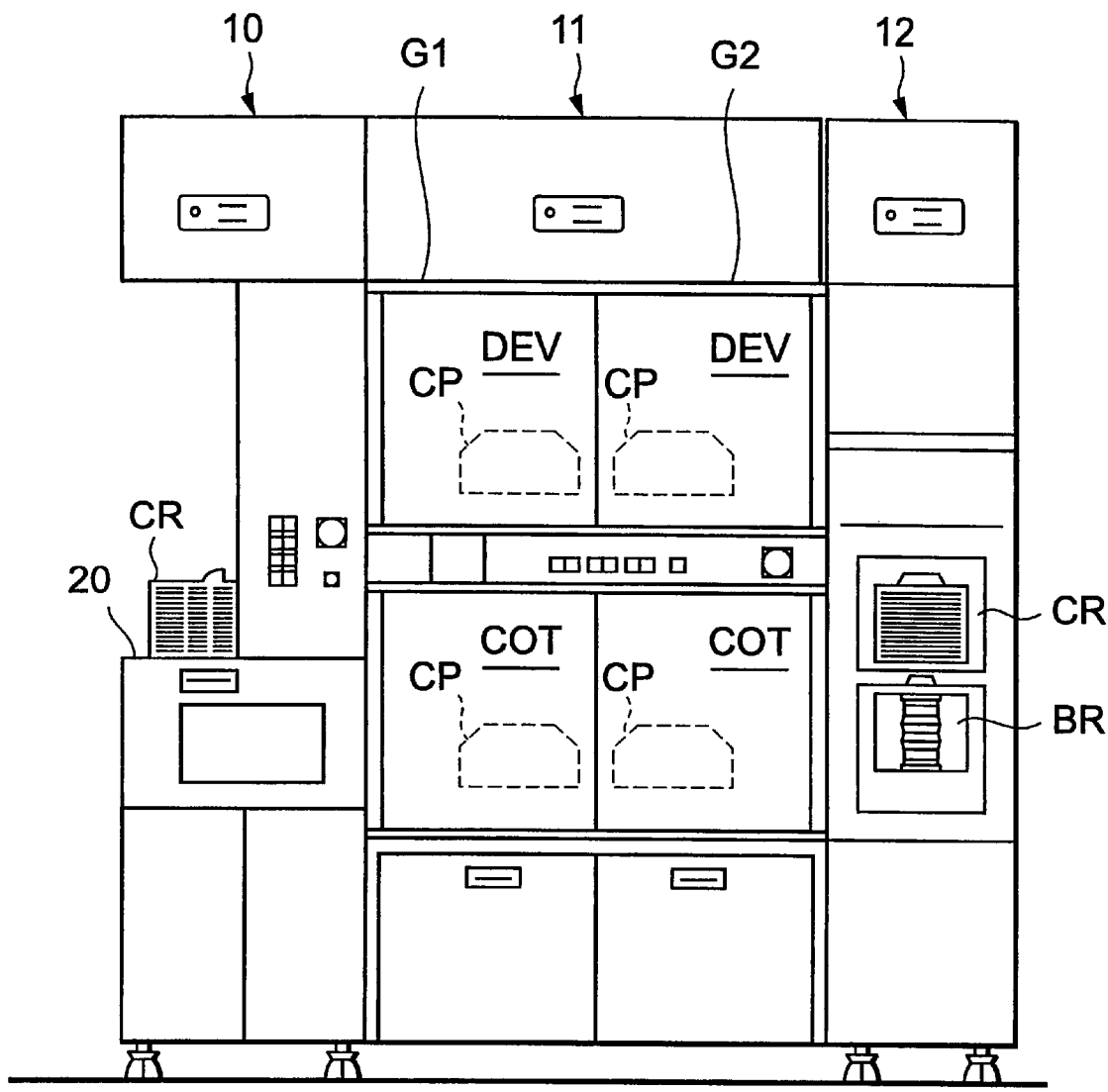
FIG. 2 is a front view of the resist coating and developing processing system shown in FIG. 1.
Figure 3:
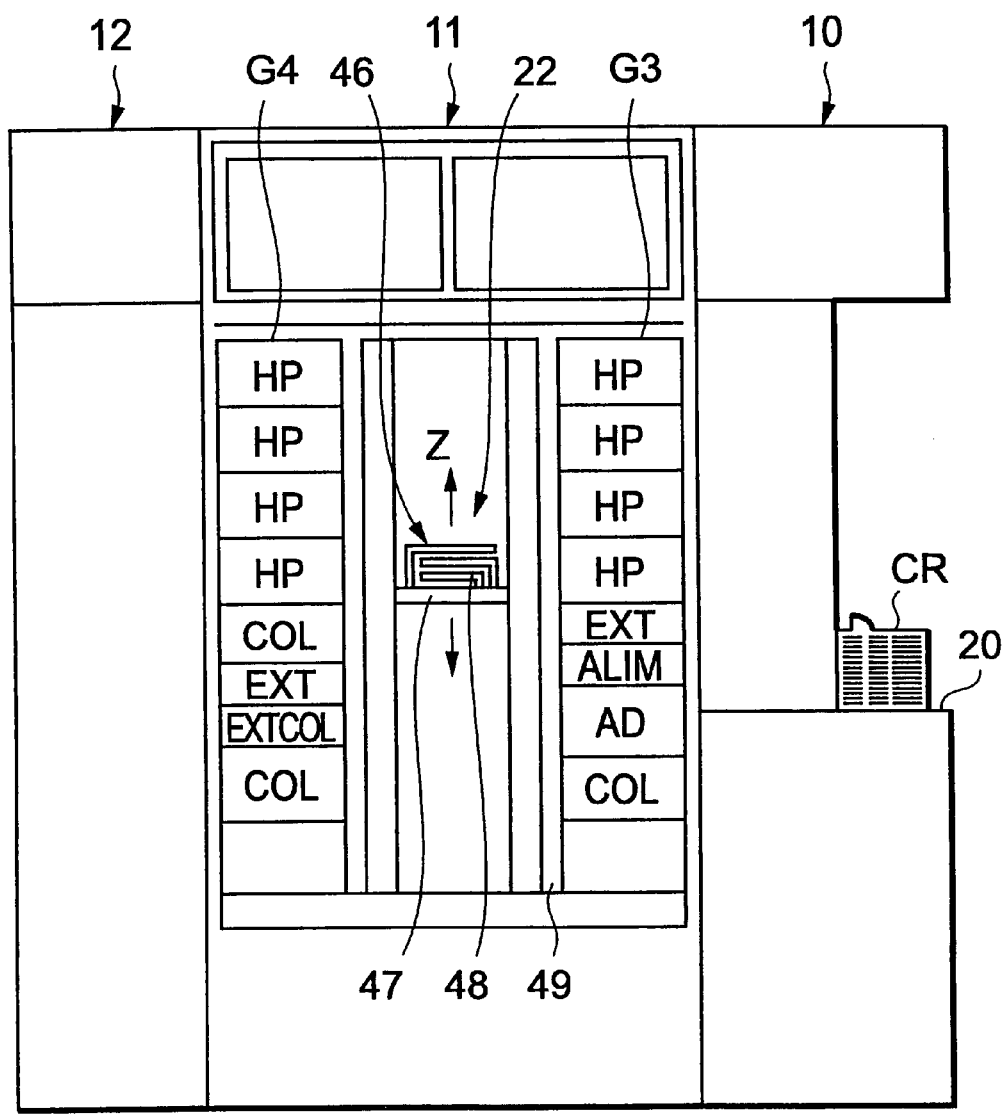
FIG. 3 is a rear view of the resist coating and developing processing system shown in FIG. 1.

FIG. 1 is a schematic plane view showing a resist coating and developing processing system mounted with a developing unit according to an embodiment of a substrate processing apparatus of the present invention, FIG. 2 is a front view thereof, and FIG. 3 is a rear view thereof.

The resist coating and developing processing system 1 includes a cassette station 10 being a transfer station, a processing station 11 having a plurality of processing units, and an interface section 12 for receiving and passing a wafer W from/to an aligner 50 provided adjacent to the processing station 11.

The aforesaid cassette station 10 has functions of carrying a plurality of, for example, 25 semiconductor wafers W (hereinafter referred to as only wafers) as objects to be processed, as a unit, housed in a wafer cassette CR from another system into this system or from this system into another system, and transferring the wafer W between the wafer cassette CR and the processing station 11.

In this cassette station 10, as shown in FIG. 1, a plurality of (four in FIG. 1) positioning projections 20a are formed on a wafer cassette mounting table 20 along an X-direction in FIG. 1, and the wafer cassettes CR can be mounted in a line with respective wafer transfer ports facing the processing station 11 at positions of the projections 20a. In the wafer cassette CR, the wafers W are arranged in a vertical direction (a Z-direction). Moreover, the cassette station 10 includes a wafer transfer mechanism 21 positioned between the wafer cassette mounting table 20 and the processing station 11. The wafer transfer mechanism 21 includes a wafer transfer arm 21a movable in the direction of arrangement of the cassettes (the X-direction) and in the direction of arrangement of the wafers W housed in the wafer cassette CR (the Z-direction) and can selectively get access to any of the wafer cassettes CR by the wafer transfer arm 21a. The wafer transfer arm 21a is also structured to be rotatable in a θ-direction so as to be also accessible to an alignment unit (ALIM) and an extension unit (EXT) included in a third processing unit group $G_3$ on the processing station 11 side which will be described later.

The processing station 11 includes a plurality of processing units for carrying out a series of processes when coating and developing are performed for the wafer W. These units are multi-tiered at predetermined positions, and the wafers W are processed one by one by these units. As shown in FIG. 1, the processing station 11 has a transfer path 22a in the middle thereof, a main wafer transfer mechanism 22 is provided in the transfer path 22a, and all the processing units are arranged around the wafer transfer path 22a. These processing units are divided into a plurality of processing unit groups, and the processing units of each processing unit group are multi-tiered along the vertical direction.

As shown in FIG. 3, the main wafer transfer mechanism 22 includes a wafer transfer device 46 which is ascendable and descendable in the vertical direction (the Z-direction) within a cylindrical supporter 49. The cylindrical supporter 49 can rotate by rotational driving force of a motor (not illustrated), and the wafer transfer device 46 can also rotate integrally with the cylindrical supporter 49.

The wafer transfer device 46 includes a plurality of holding members 48 which are movable in a forward and a rearward direction of a transfer base 47. The delivery of the wafer W between the processing units is performed by these holding members 48.

As shown in FIG. 1, four processing unit groups $G_1$, $G_2$, $G_3$, and $G_4$ are actually arranged around the wafer transfer path 22a in this embodiment, and a processing unit group $G_5$ can be disposed as required.

Out of these unit groups, the first and second processing unit groups $G_1$ and $G_2$ are arranged in a row on the front side of the system (on the lower side in FIG. 1), the third processing unit group $G_3$ is arranged adjacent to the cassette station 10, and the fourth processing unit group $G_4$ is arranged adjacent to the interface section 12. Moreover, the fifth processing unit group $G_5$ can be arranged on the rear side.

In the above case, as shown in FIG. 2, in the first processing unit group $G_1$, two spinner-type processing units in which the wafer W is mounted on a spin chuck (not illustrated) inside a cup CP to undergo predetermined processing are vertically arranged in two stages. In this embodiment, a resist coating unit (COT) for applying a resist onto the wafer W and a developing unit (DEV) for developing a pattern of the resist are vertically arranged in two stages from the bottom in order. Similarly in the second processing unit group $G_2$, a resist coating unit (COT) and a developing unit (DEV) as two spinner-type processing units are vertically arranged in two stages from the bottom in order.

The reason why the resist coating unit (COT) and the like are disposed on the lower tier side is that drainage of a resist solution is essentially more complex in terms of both mechanism and maintenance than that of a developing solution, and that the complexity is mitigated by disposing the resist coating unit (COT) and the like at the lower stage as described above. It is possible, however, to arrange the resist coating unit (COT) and the like at the upper tier as required.

As shown in FIG. 3, in the third processing unit group $G_3$, oven-type processing units in each of which the wafer W is placed on a mounting table SP to undergo predetermined processing are multi-tiered. Namely, a cooling unit (COL) for performing cooling processing, an adhesion unit (AD) for performing so-called hydrophobic processing to enhance adhesive property of the resist, an alignment unit (ALIM) for performing alignment, an extension unit (EXT) for carrying the wafer W in and out, and four hot plate units (HP) for performing heat processing for the wafer W before and after exposure processing and after developing processing are vertically arranged in eight stages from the bottom in order. It is suitable to provide a cooling unit (COL) in place of the alignment unit (ALIM) and to give the cooling unit (COL) an alignment function.

Also in the fourth processing unit group $G_4$, oven-type processing units are multi-tiered. Specifically, a cooling unit (COL), an extension and cooling unit (EXTCOL) which is a wafer carrying in/out section provided with a chill plate, an extension unit (EXT), a cooling unit (COL), and four hot plate units (HP) are vertically arranged from the bottom in order.

The above arrangement of the cooling unit (COL) and the extension and cooling unit (EXTCOL) having low processing temperature at the lower stage and the hot plate units (HP) having high processing temperature at the upper stage can reduce thermal mutual interference between units. Random multi-tiered arrangement is naturally suitable.

As described above, the fifth processing unit group $G_5$ can be provided on the rear side of the main wafer transfer mechanism 22. In the case where the fifth processing unit group $G_5$ is provided, it can be moved along guide rails 25 laterally when seen from the main wafer transfer mechanism 22. Accordingly, even when the fifth processing unit group $G_5$ is provided, a space portion is secured by sliding the fifth processing unit group $G_5$ along the guide rails 25, so that maintenance operations for the main wafer transfer mechanism 22 can be easily performed from the back thereof. In this case, a space can be secured not only by moving the fifth processing unit group $G_5$ linearly, but also by turning it. Incidentally, one processing unit group basically having a structure in which oven-type processing units are multi-tiered likewise with the third and fourth processing unit groups $G_3$ and $G_4$ can be used as the fifth processing unit group $G_5$.

The aforesaid interface section 12 has the same length as the processing station 11 in a depth direction (the X-direction). As shown in FIG. 1 and FIG. 2, a transportable pickup cassette CR and a fixed-type buffer cassette BR are vertically arranged in two stages at the front of the interface section 12, a peripheral aligner 23 is disposed at the rear, and a wafer transfer body 24 is disposed at the center. The wafer transfer body 24 moves in the X-direction and the Z-direction to be accessible to both the cassettes CR and BR, and the peripheral aligner 23. Moreover, the wafer transfer body 24 is rotatable in the θ-direction to be accessible to the extension unit (EXT) included in the fourth processing unit group $G_4$ of the processing station 11 and also to a wafer delivery table (not illustrated) on the adjacent aligner side.

In the resist coating and developing processing system 1 structured as above, the wafer transfer arm 21a of the wafer transfer mechanism 21 first gets access to the wafer cassette CR housing unprocessed wafers W on the cassette mounting table 20 and takes one wafer W out of the cassette CR in the cassette station 10 and transfers the wafer W to the extension unit (EXT) of the third processing unit group $G_3$.

The wafer W is transferred from the extension unit (EXT) into the processing station 11 by means of the wafer transfer device 46 of the main wafer transfer mechanism 22. Then, the wafer W is aligned in the alignment unit (ALIM) of the third processing unit group $G_3$ and thereafter transferred to the adhesion unit (AD) to undergo hydrophobic processing (HMDS processing) for enhancing adhesive property of the resist. Since this processing involves heating, the wafer W is then transferred to the cooling unit (COL) by the wafer transfer device 46 and cooled.

The wafer W which has been cooled in the cooling unit (COL) after the completion of the adhesion processing is subsequently transferred to the resist coating unit (COT) by the wafer transfer device 46, where a coating film is formed. After the completion of the coating processing, the wafer W undergoes prebake processing in any one of the hot plate units (HP) of the processing unit groups $G_3$ and $G_4$ and is cooled in any one of the cooling units (COL).

The cooled wafer W is transferred to the alignment unit (ALIM) of the third processing unit group $G_3$ and aligned there, and thereafter the wafer W is transferred to the interface section 12 via the extension unit (EXT) of the fourth processing unit group $G_4$.

In the interface section 12, peripheral exposure is performed for the wafer W by the peripheral aligner 23 to remove the excess resist, and the wafer W is transferred to the aligner 50 provided adjacent to the interface section 12, where the resist film of the wafer W undergoes exposure processing in accordance with a predetermined pattern.

The exposed wafer W is returned again to the interface section 12 and transferred to the extension unit (EXT) included in the fourth processing unit group $G_4$ by the wafer transfer body 24. The wafer W is transferred to any one of the hot plate units (HP) by the wafer transfer device 46 to undergo post-exposure bake processing and then cooled by the cooling unit (COL).

The wafer W is then transferred to the developing unit (DEV), where the exposed pattern is developed. After the completion of the developing, the wafer W is transferred to any one of the hot plate units (HP) to undergo postbake processing and then cooled by the cooling unit (COL). After the completion of such a series of processing, the wafer W is returned to the cassette station 10 via the extension unit (EXT) of the third processing unit group $G_3$ and housed in any of the wafer cassettes CR.

Figure 4:
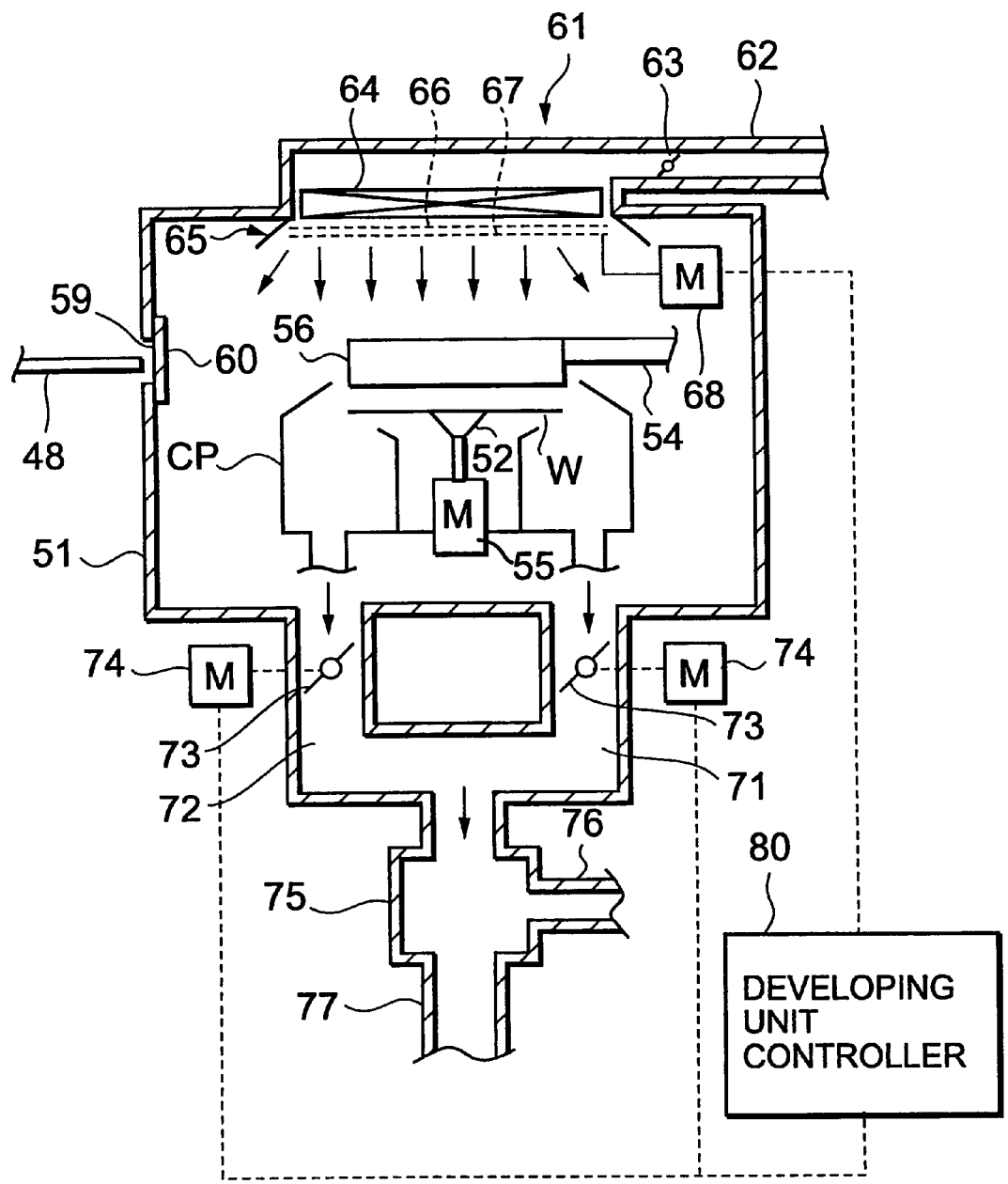
FIG. 4 is a sectional view showing the entire structure of a developing unit according to the embodiment of the present invention.

Next, the developing unit (DEV) will be explained with reference to FIG. 4 to FIG. 6. FIG. 4 is a schematic sectional view of the developing unit (DEV), FIG. 5 is a schematic plan view of the developing unit (DEV) shown in FIG. 4, and FIG. 6 is a timing chart of a processing process of the developing unit.

As shown in FIG. 4, an annular cup CP is disposed in a processing chamber 51 of the developing unit (DEV), and a spin chuck 52 for suction-holding the wafer W is disposed inside the cup CP. The spin chuck 52 is rotationally driven by a motor 55.

Figure 5:
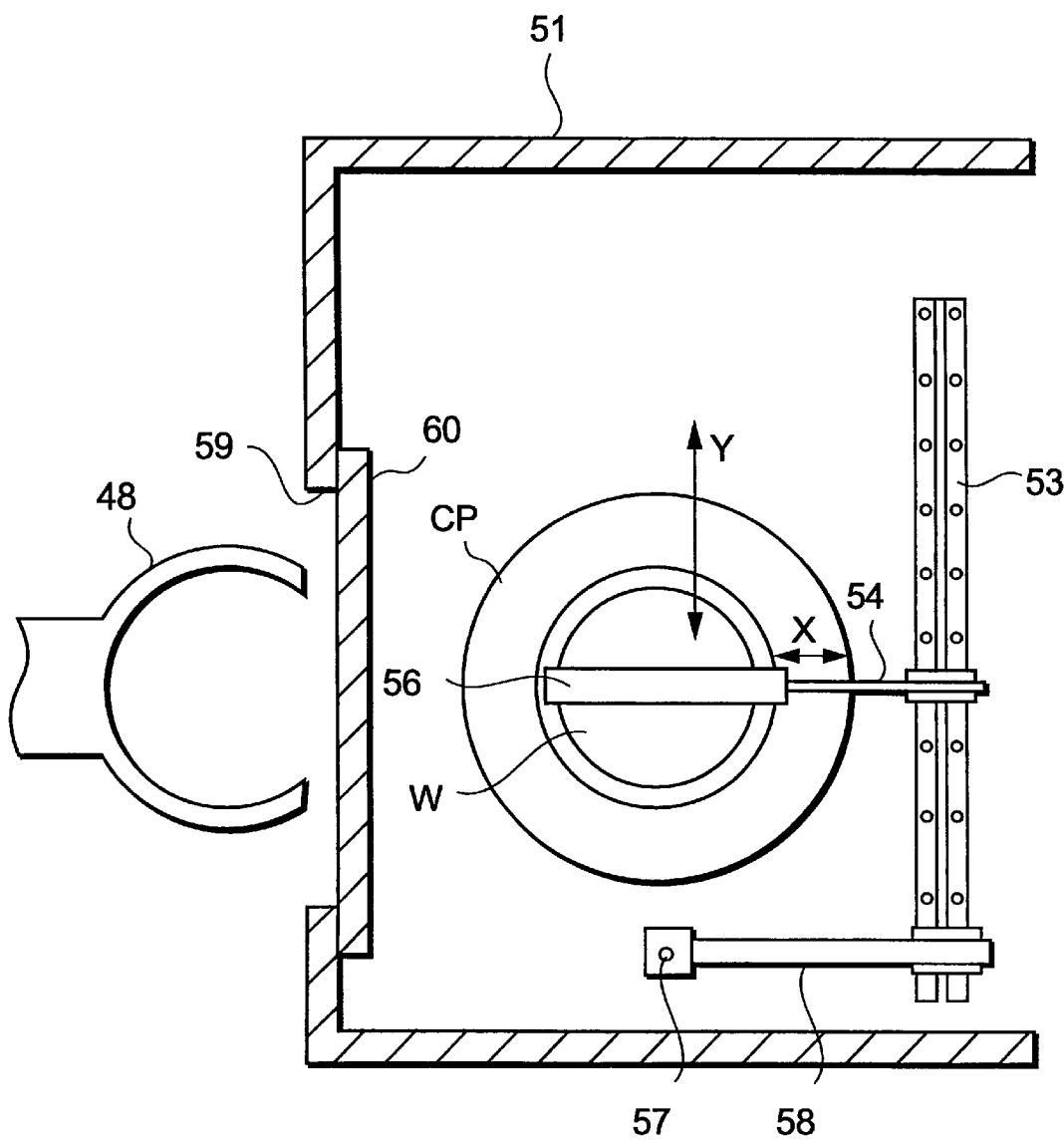
FIG. 5 is a plan view of the developing unit according to the embodiment of the present invention.
Figure 6:
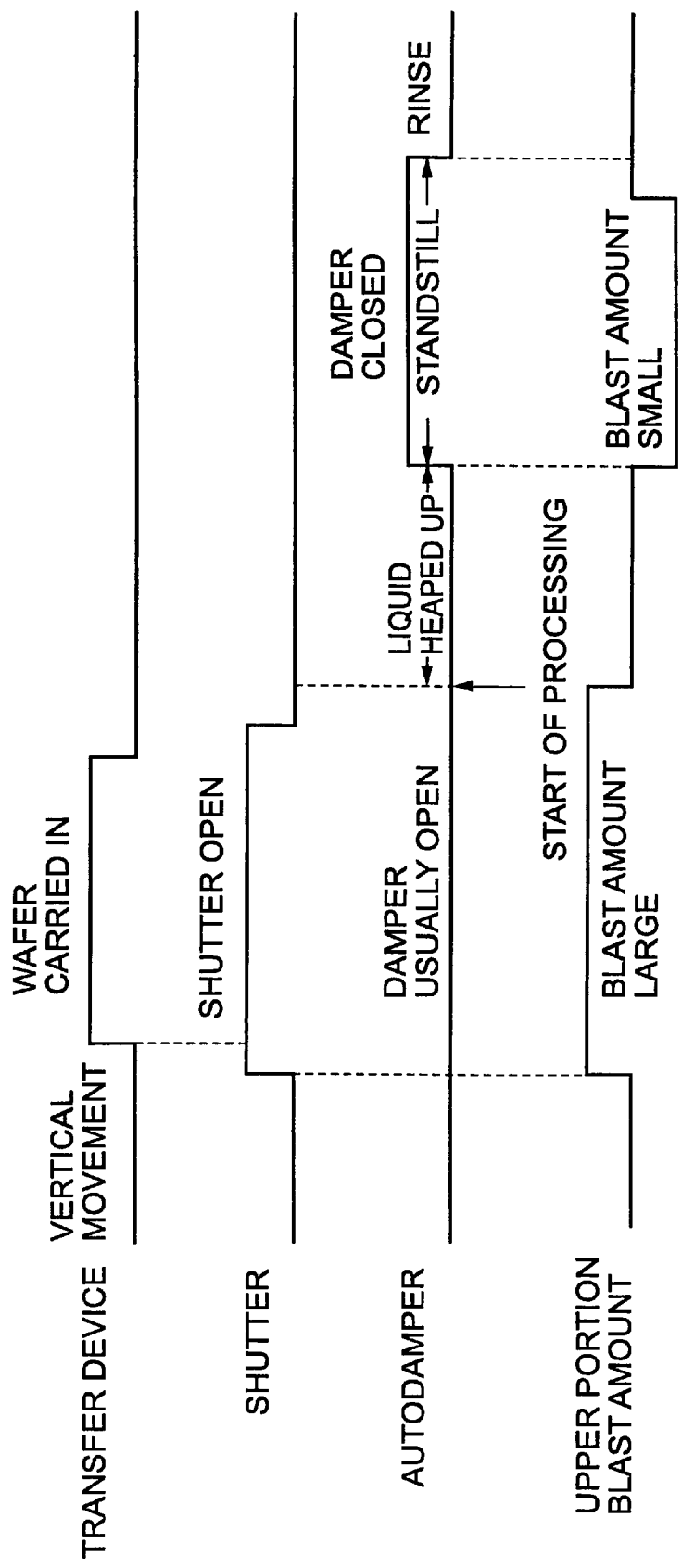
FIG. 6 is a timing chart of a processing process of the developing unit.

As shown in FIG. 5, guide rails 53 extending in the Y-direction are provided in the processing chamber 51, and a nozzle arm 54 is provided to be movable along the Y-direction on the guide rails 53 by a drive mechanism not illustrated. A developing solution supply nozzle 56 is attached to the tip of the nozzle arm 54. The developing solution supply nozzle 56 is long and slender, and disposed to be horizontal in the longitudinal direction thereof, and has a length slightly longer than the diameter of the wafer W. When a developing solution is applied, the developing solution supply nozzle 56 is disposed immediately above a central portion of the wafer W, the developing solution supplied from a developing solution supply section not illustrated through a pipe is discharged in the form of a belt from a discharge port of the developing solution supply nozzle 56, and concurrently the wafer W is rotated more than ½ turn, for example, one full turn, whereby the developing solution is applied over the entire face of the wafer W. The developing solution supply nozzle 56 may be provided with a plurality of discharge ports in a row or with a slit discharge port.

Further, the developing unit (DEV) has a rinse nozzle 57 for discharging a cleaning solution, and the rinse nozzle 57 is attached to the tip of a nozzle arm 58 provided to be movable in the Y-direction on the guide rails 53. Thus, after the completion of developing processing by the developing solution, the rinse nozzle 57 moves to a position above the wafer W and discharges the cleaning solution to the wafer W.

An aperture 59 through which the tweezers 48 for holding the wafer W of the wafer transfer device 46 enter the processing chamber 51 when transferring the wafer W is provided in one side of the processing chamber 51, and a shutter 60 for opening and closing the aperture 59 is provided to be ascendable and descendable. The opening and closing of the shutter 60 are controlled by a developing unit controller 80 as will be described later.

A blast unit 61 is provided on top of the processing chamber 51. A blast pipe 62 extending from a blower not illustrated is connected to the blast unit 61, and a damper 63 is provided midway between them. Provided in the unit 61 is a filter 64 for filtering air to be sent into the processing chamber 51, and under the filter 64, a slit damper 65 for regulating the air to be sent into the processing chamber 51 is provided. The slit damper 65 is constructed by an upper slit plate 66 and a lower slit plate 67, and an interval between slits is adjusted by horizontally moving the lower slit plate 67 by a motor 68, whereby the flow rate of the air to be sent into the processing chamber 51 is controlled.

A pair of exhaust pipes 71 and 72 are connected to the bottom of the processing chamber 51, and autodampers 73 are provided in these exhaust pipes 71 and 72 so as to be freely opened and closed. The autodampers 73 are driven by a motor 74 and the degrees of opening are adjusted, whereby the amount of exhaust can be controlled. A mist trap 75 is provided at the lower ends of the pair of exhaust pipes 71 and 72, and an exhaust pipe 76 for exhausting gas and a drain 77 for draining solutions extend from the mist trap 75.

Provided in the developing unit (DEV) is a developing unit controller 80 for controlling the entire developing unit (DEV) including the rotation of the spin chuck 52, discharge of the developing solution from the developing solution nozzle 56, movements of the nozzle arms 54 and 58, and the like.

In this embodiment, control signals are sent from the developing unit controller 80 to the motor 68 for moving the lower slit plate 67 and to the motor 74 for the autodampers 73 in the exhaust pipes 71 and 72.

Next, sequence operation of developing processing in the developing unit (DEV) structured as above will be explained with reference to FIG. 6.

The wafer W cooled after undergoing post-exposure bake processing after being exposed is carried into the developing unit (DEV) by the wafer transfer device 46. On this occasion, when the transfer device 46 vertically moves from the cooling unit (COL) and reaches the front of the shutter 60 of the developing unit (DEV), the shutter 60 is opened.

Concomitantly with the opening of the shutter 60, a control signal is sent from the developing unit controller 80 to the motor 68, the slit plate 67 is moved by the motor 68, intervals of the slit damper 65 are widened, thus increasing a blast amount into the processing chamber 51 as shown in FIG. 6.

The control is performed so that the blast amount is increased concomitantly with the opening of the shutter 60 as described above, and hence the pressure in the processing chamber 51 is maintained almost constant. Consequently, a drop in pressure accompanying the opening operation of the shutter 60 can be compensated and a change in pressure in the processing chamber 51 can be prevented to the utmost, thereby eliminating an influence accompanying the change in pressure. Incidentally, the blast amount may be controlled by changing the degree of opening of the damper 63 instead of changing the intervals of the slit damper 65.

Timing in which the blast amount is increased is suitable if it is concomitant with the opening operation of the shutter 60, and it may be simultaneous with or immediately before or after the opening of the shutter 60. Moreover, when the shutter 60 is opened, instead of increasing the blast amount, the motor 74 may be controlled by the developing unit controller 80 to control the degrees of opening of autodampers 73 so that the exhaust amount is decreased.

Subsequently, the wafer W is transferred to a position immediately above the cup CP by the tweezers 48 of the wafer transfer device 46 and vacuum-sucked by the spin chuck 52. Thereafter, the tweezers 48 are withdrawn from the processing chamber 51, and then the shutter 60 is closed. Concomitantly with the closing operation of the shutter 60 (that is, simultaneously with, or immediately before or after the closing of the shutter 60), a control signal is sent from the developing unit controller 80 to the motor 68, whereby the slit plate 67 is moved by the motor 68. As a result, the intervals of the slit damper 65 are narrowed, so that the blast amount into the processing chamber 51 is returned to its original amount. In the case where the exhaust amount is decreased when the shutter 60 is opened, the degrees of opening of autodampers 73 may be controlled by the motor 74 based on the control signal from the developing unit controller 80 so that the exhaust amount is returned to its original amount.

Thereafter, the developing solution supply nozzle 56 is moved to a position above the wafer W, and the developing solution is applied over the entire face of the wafer W, for example, so as to have a thickness of 1 mm (heaping of the solution) by rotating the wafer W more than ½ turn, for example, one full turn while the developing solution is being discharged in the form of a belt from the developing solution supply nozzle 56. The developing solution stands still for a predetermined period of time while being heaped up on the wafer W, and developing is progressed by natural convection.

While the developing solution is at a standstill with it being heaped up on the wafer W, the autodampers 73 are closed and the exhaust operation is stopped in order to prevent a change in line width due to a change in temperature. Concomitantly with the stop of the exhaust operation, a control signal is sent from the developing unit controller 80 to the motor 68, so that the slit plate 67 is moved by the motor 68. As a result, the intervals of the slit damper 65 are narrowed, so that the blast amount into the processing chamber 51 is decreased.

The control is performed so that the blast amount is decreased concomitantly with the stop of the exhaust operation as described above, and hence the pressure in the processing chamber is maintained almost constant. Consequently, a rise in pressure accompanying the stop of the exhaust operation can be compensated and a change in pressure in the processing chamber 51 can be prevented to the utmost, thereby eliminating an influence accompanying the change in pressure. Incidentally, timing in which the blast amount is decreased is suitable if it is concomitant with the stop of the exhaust operation, and it may be simultaneous with, or immediately before or after the stop of the exhaust operation.

Before the operation of heaping up the developing solution and making it stand still is completed, a control signal is sent from the developing unit controller 80 to the motor 68, whereby the slit plate 67 is moved by the motor 68. As a result, the intervals of the slit damper 65 are widened, so that the blast amount into the processing chamber 51 is returned to its original amount. Thereafter, the autodampers 73 are opened and the exhaust operation is resumed. Incidentally, although it is desirable that timing in which the blast amount is returned to its original amount is prior to the resumption of the exhaust operation as described above, the timing may be simultaneous with or after the resumption.

After the completion of the standstill time of the developing solution, the wafer W is rotated by the spin chuck 52, so that the developing solution is blown off. Thereafter, the rinse nozzle 57 is moved to a position above the wafer W, and the cleaning solution is discharged from the rinse nozzle 57 to wash away the developing solution remaining on the wafer W. The wafer W is then rotated at a high speed by the spin chuck 52, whereby the developing solution and cleaning solution remaining on the wafer W are blown away and the wafer W is dried. Thus, a series of developing processing is completed.

As described above, in this embodiment, when the pressure in the processing chamber 51 changes due to various factors, the blast amount and/or the exhaust amount is controlled by the developing unit controller 80 concomitantly with the change in pressure, to maintain the pressure in the processing chamber nearly constant. Consequently a change in pressure in the processing chamber 51 can be prevented to the utmost, thereby eliminating an influence accompanying the change in pressure.

Next, another embodiment of the present invention will be explained.

Figure 7:
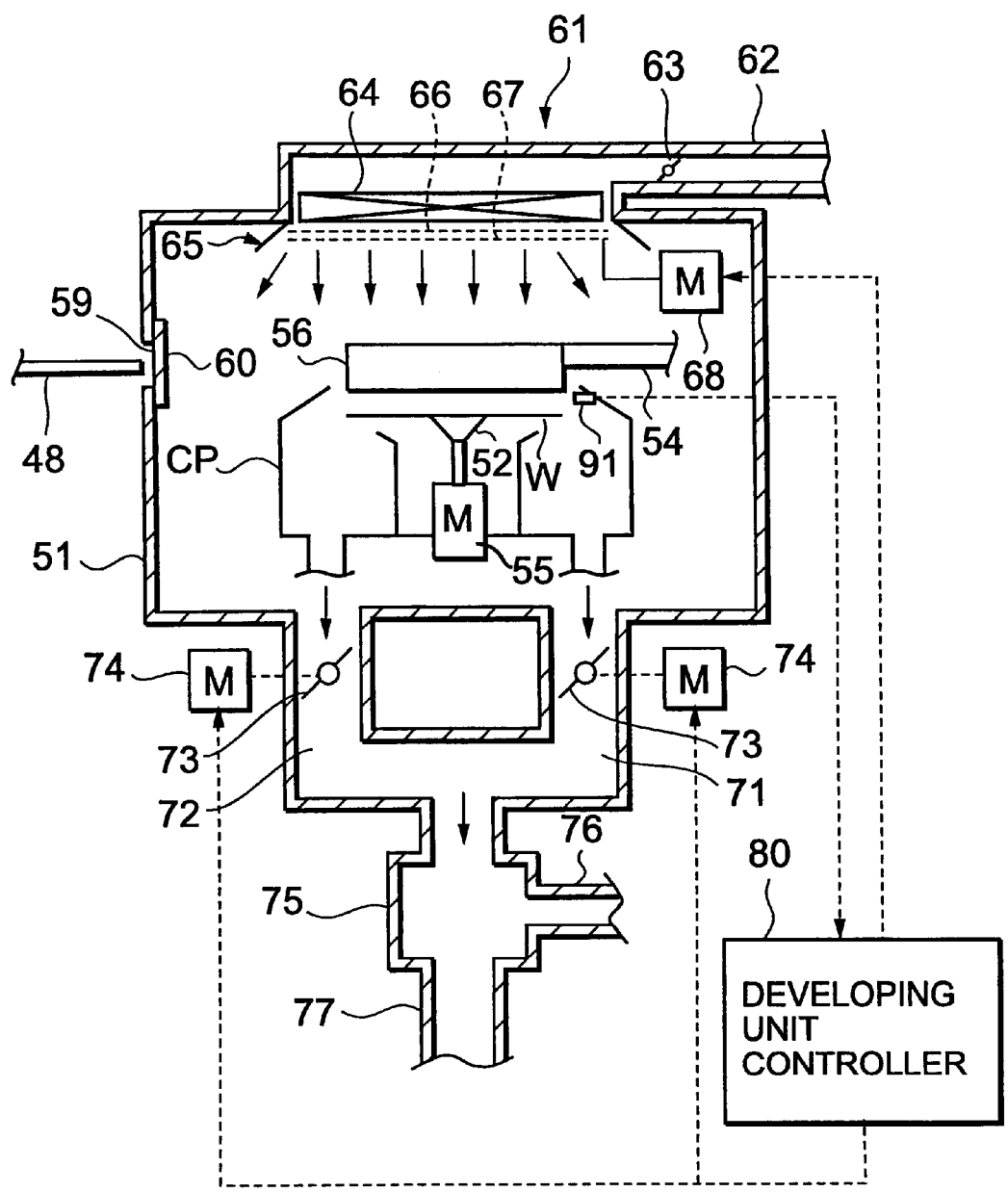
FIG. 7 is a sectional view showing the entire structure of a developing unit according to another embodiment of the present invention.

In this embodiment, as shown in FIG. 7, a pressure sensor 91 for detecting the pressure in the processing chamber 51 is provided, for example, inside the cup CP in the processing chamber 51. A result detected by the pressure sensor 91 is sent to the developing unit controller 80. Based on the detected result, the developing unit controller 80 controls the blast amount and/or the exhaust amount following a change in pressure so as to maintain the pressure in the processing chamber 51 nearly constant. Thus, more precise pressure control can be performed. Further, the provision of the pressure sensor 91 for detecting the pressure in the processing chamber 51 inside the cup CP, that is, the provision of the pressure sensor 91 at a position close to the wafer W under processing enables more accurate pressure detection. Accordingly, the pressure sensor 91 may be provided, for example, outside the cup CP. In these embodiments, it is suitable that to control the pressure, the blast amount is mainly controlled, and that the exhaust amount is controlled only when a desired pressure is not obtained by the control of the blast amount. By performing the above control, that is, by mainly performing the control of the blast amount, entry of particles into the processing chamber 51 can be effectively prevented.

Figure 8:
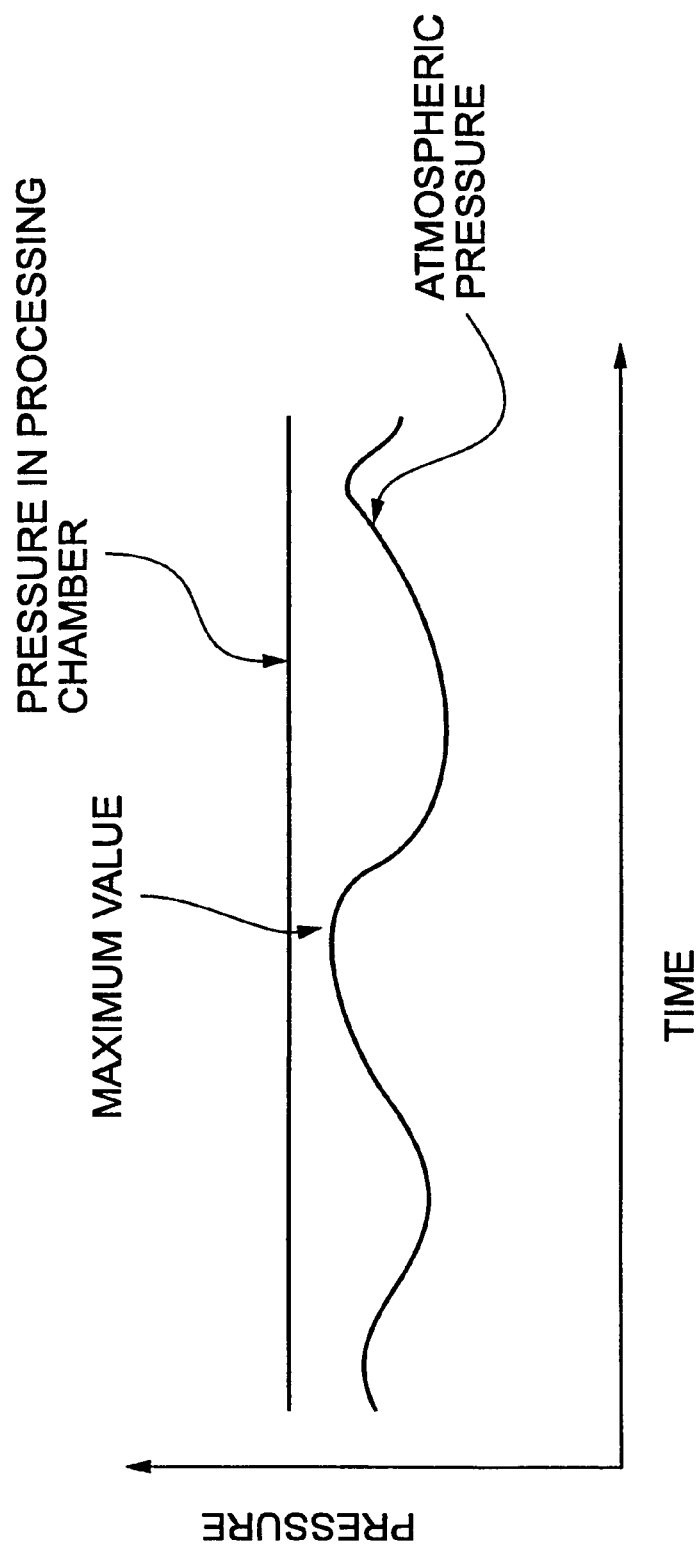
FIG. 8 is a graph for explaining still another embodiment of the present invention.

Further, as shown in FIG. 8, the developing unit controller 80 controls the blast amount and/or the exhaust amount such that the pressure in the processing chamber 51 is maintained to be always higher than a maximum value of the range of change in atmospheric pressure. As a result, a change in pressure in the processing chamber 51 can be prevented to the utmost without being influenced by a change in atmospheric pressure.

Next, still another embodiment of the present invention will be explained.

Figure 9:
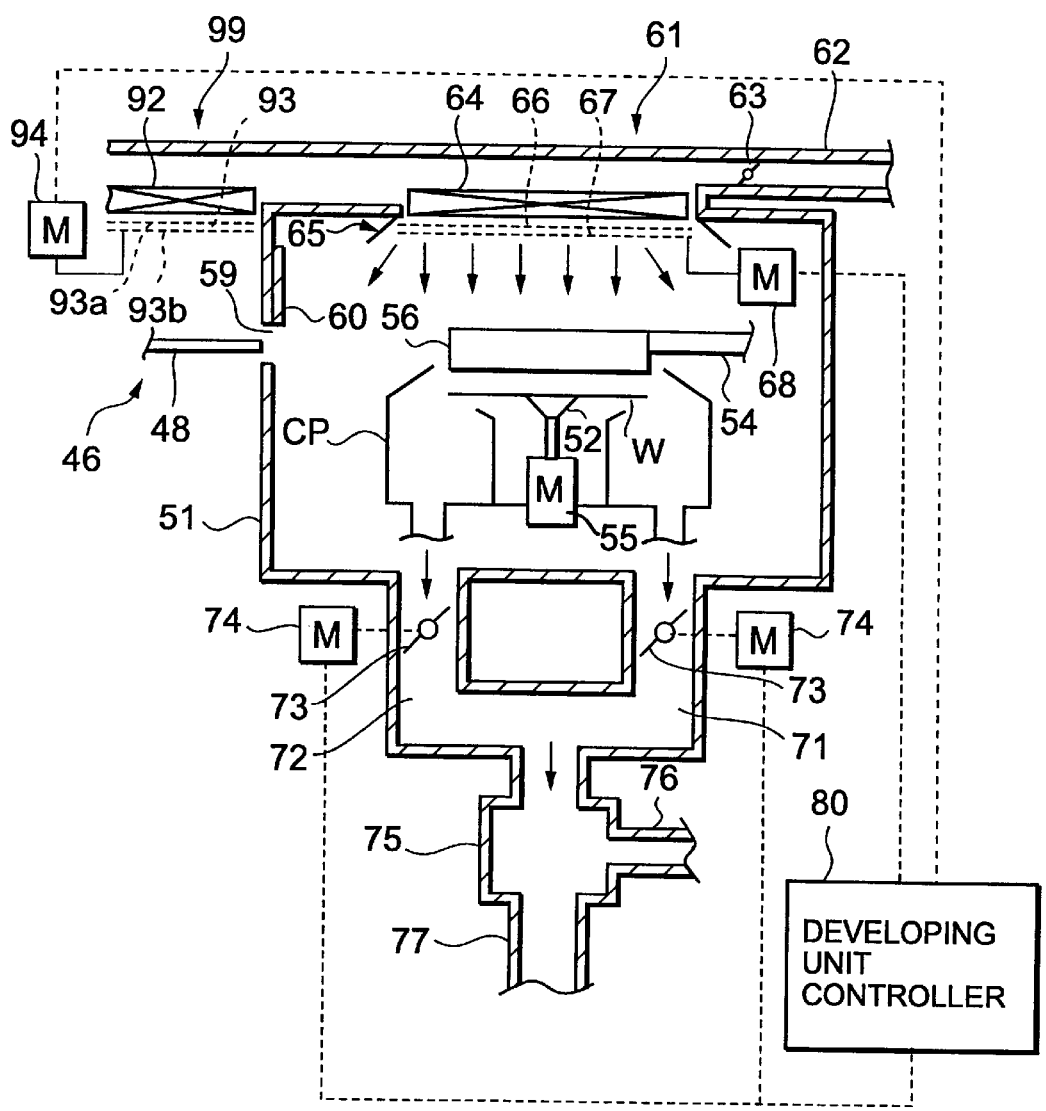
FIG. 9 is a sectional view showing the entire structure of a developing unit according to yet another embodiment of the present invention.

In this embodiment, as shown in FIG. 9, a blast unit 99 for supplying down-flowing clean air is provided above the wafer transfer device 46 having the holding members 48. The blast pipe 62 is connected to the blast unit 99. A filter 92 for filtering air to be sent to the wafer transfer device 46 is provided in the blast unit 99, and a slit damper 93 for regulating the air to be sent to the wafer transfer device 46 is provided under the filter 92. The slit damper 93 is constructed by an upper slit plate 93a and a lower slit plate 93b. The interval between slits is adjusted by horizontally moving the lower slit plate 93b by means of a motor 94 so as to control the flow rate of the air to be sent into the wafer transfer device 46.

In the case where the control of the pressure in the processing chamber 51 is performed as in the aforesaid embodiments, air flows out from the side of the processing chamber 51 to the side of the wafer transfer device 46 through the aperture 59 when the shutter 60 is opened. The wafer W on the wafer transfer device 46 side is sometimes contaminated by particles and the like. Hence, in this embodiment, the blast amount from the blast unit 99 when the aperture 59 is opened is made larger than when the aperture 59 is closed. It is more preferable that the blast amount from the blast unit 99 is controlled so as to produce an equilibrium state in which air does not flow to either side through the aperture 59. The performance of such control can prevent the wafer W on the wafer transfer device 46 side from being contaminated by particles and the like.

Next, yet another embodiment of the present invention will be explained.

Figure 10:
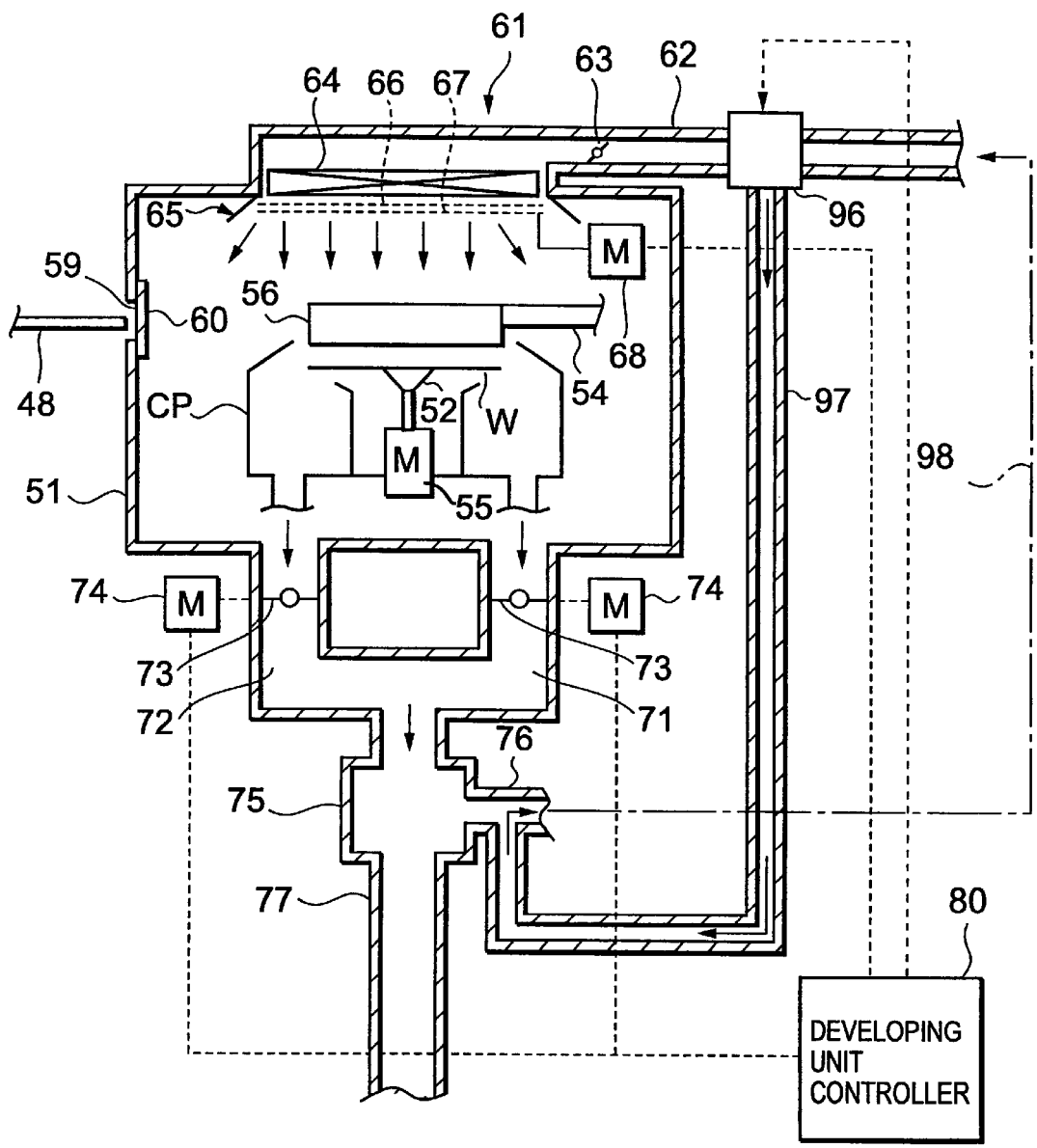
FIG. 10 is a sectional view showing the entire structure of a developing unit according to still another embodiment of the present invention.

In this embodiment, as shown in FIG. 10, a three-way valve 96 is provided on the blast pipe 62 extending from the blower not illustrated, and one side of the output side of the three-way valve 96 is connected to the blast unit 61 side and the other side thereof is connected to the exhaust pipe 76.

When sending air from the blast unit 61 is stopped under the control of the developing unit controller 80, output of the three-way valve 96 is switched to the exhaust pipe 76 side, and air is bypassed. Incidentally, the bypassed air may be circulated to the blast unit 61 side by providing a circulating line 98. Consequently, clean air can be utilized effectively.

Incidentally, the present invention is not limited to the aforesaid embodiments and can be modified variously. For example, the examples in which the present invention is applied to the developing unit are shown in the aforesaid embodiments, but not limited to these examples, the present invention can be applied to any substrate processing apparatus provided with a blast unit and an exhaust unit at the top and the bottom of a processing chamber. Moreover, the cases where a semiconductor wafer is used as a substrate are explained, but not limited to these cases, the present invention is applied to processing for other substrates such as a substrate for a liquid crystal display (LCD) and the like.

As explained above, according to the present invention, even when a processing unit is downsized and the pressure in the processing chamber is prone to change, the blast amount and/or the exhaust amount is controlled concomitantly with the change in pressure. Thus, the pressure in the processing chamber is maintained nearly constant, so that a change in pressure in the processing chamber can be prevented to the utmost, to eliminate an influence accompanying the change in pressure.

Further, even when the processing unit is downsized and the pressure in the processing chamber is prone to change accompanying the opening and closing of a shutter for carrying a substrate to be processed in and out, concomitantly with the opening of the shutter, control is performed so that the blast amount is increased or the exhaust amount is decreased to maintain the pressure in the processing chamber almost constant. As a result, a drop in pressure when the shutter is opened can be compensated, and a change in pressure in the processing chamber can be prevented to the utmost, thereby eliminating an influence accompanying the change in pressure.

Furthermore, when solution processing using a processing solution is performed for the substrate, during a predetermined period of time after the processing solution is supplied to the substrate, the exhaust operation by the exhaust unit is stopped in order to prevent a change in temperature and the like. Even when the pressure in the processing chamber arises due to the stop of the exhaust operation, the blast amount of the blast unit is decreased concomitantly with the stop of the exhaust operation to maintain the pressure in the processing chamber almost constant. Accordingly, the rise in pressure following the stop of the exhaust operation can be compensated, and a change in pressure in the processing chamber can be prevented to the utmost, thereby eliminating an influence accompanying the change in pressure.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A substrate processing apparatus, comprising:
    a processing chamber in which a substrate is developed by a developing solution applied over the substrate;
    a filter configured to filter air to be sent into the processing chamber;
    a blast unit configured to send the filtered air into said processing chamber from the top toward the bottom thereof;
    an exhaust unit configured to exhaust gas from within said processing chamber through the bottom thereof; and
    a control unit configured to regulate at least one of a blast amount of said blast unit and an exhaust amount of said exhaust unit concomitantly with a change in pressure in said processing chamber to maintain the pressure in said processing chamber nearly constant.

2. The apparatus as set forth in claim 1, further comprising:
    a pressure sensor disposed in said processing chamber and configured to detect the change in pressure in said processing chamber,
    said control unit regulating at least one of the blast amount of said blast unit and the exhaust amount of said exhaust unit based on a detected result by said pressure sensor.

3. The apparatus as set forth in claim 2, further comprising:
    a cup disposed in said processing chamber and configured to process the substrate therein,
    said pressure sensor being disposed at a position near the substrate which is processed inside said cup in said cup.

4. The apparatus as set forth in claim 1,
    wherein said control unit is configured to regulate the blast amount of said blast unit concomitantly with the change in pressure in said processing chamber and regulates the exhaust amount of said exhaust unit when the limit to which the pressure in said processing chamber is maintained nearly constant by the regulation of the blast amount of said blast unit is exceeded.

5. The apparatus as set forth in claim 1,
    wherein said control unit is configured to maintain the pressure in said processing chamber at a value larger than a maximum value of atmospheric pressure which changes.

6. The apparatus as set forth in claim 1, further comprising:
    a bypass section configured to bypass the gas sent by said blast unit to said exhaust unit.

7. The apparatus as set forth in claim 6,
    wherein said bypass section is configured to bypass the gas sent by said blast unit to said exhaust unit when the pressure in said processing chamber is maintained nearly constant.

8. The apparatus as set forth in claim 6, further comprising:
    a circulating mechanism configured to circulate the gas bypassed to said exhaust unit by said bypass section to said blast unit.

9. The apparatus according to claim 1, wherein the exhaust unit stops and the blast unit decreases the blast amount while the developing solution is at a standstill with it being heaped upon the substrate in order to prevent a change in line width due to a change in temperature.

10. The apparatus according to claim 9, wherein the blast unit and the exhaust unit resume after a standstill time of the developing solution.

11. A substrate processing apparatus, comprising:
    a processing chamber in which a substrate is developed by a developing solution applied over the substrate;
    a filter configured to filter air to be sent into the processing chamber;
    a blast unit configured to send the filtered air into said processing chamber from the top toward the bottom thereof;
    an exhaust unit configured to exhaust gas from within said processing chamber through the bottom thereof;
    a carrying in/out port configured to carry the substrate into said processing chamber and out of said processing chamber;
    a shutter configured to open and close said carrying in/out port; and
    a control unit configured to perform such control that a blast amount of said blast unit is increased or an exhaust amount of said exhaust unit is decreased concomitantly with the opening of said shutter when said shutter is opened to maintain pressure in said processing chamber nearly constant.

12. The apparatus as set forth in claim 11,
    wherein said control unit is configured to close said shutter after the substrate is carried into said processing chamber, and simultaneously with, or immediately before or after the closing of said shutter, returns the blast amount of said blast unit or the exhaust amount of said exhaust unit to its original amount.

13. The apparatus as set forth in claim 11, further comprising:
    a substrate transfer device configured to receive and pass the substrate from and to said processing chamber;
    an air supply section disposed above said substrate transfer device and configured to supply down-flowing clean air; and
    an air quantity regulating mechanism configured to regulate a quantity of clean air to be supplied by said air supply section according to the opening and closing of said shutter.

14. The apparatus as set forth in claim 13,
    wherein said air quantity regulating mechanism is configured to increase the quantity of air when said shutter is opened.

15. A substract processing apparatus, comprising:
    a processing chamber configured to house a substrate;

a processing solution supply mechanism configured to supply a developing solution over the substrate in said processing chamber;

a filter configured to filter air to be sent into the processing chamber;

a blast unit configured to send the filtered air into said processing chamber from the top toward the bottom thereof;

an exhaust unit configured to exhaust gas from within said processing chamber through the bottom thereof; and a control unit configured to stop an exhaust operation of said exhaust unit during a predetermined period of time after the developing solution is supplied over the substrate and concomitantly with the stop of the exhaust operation, decrease a blast amount of said blast unit to maintain pressure in said processing chamber nearly constant.

16. The apparatus as set forth in claim 15, wherein said control unit is configured to decrease the blast amount of said blast unit simultaneously with, or immediately before or after the stop of the exhaust operation of said exhaust unit.

17. The apparatus as set forth in claim 15, wherein said control unit is configured to return the blast amount of said blast unit to its original amount simultaneously with, or immediately before or after resumption from the stop of the exhaust operation of said exhaust unit.

18. The apparatus as set forth in claim 15, wherein said exhaust unit is disposed in an exhaust pipe connected to said processing chamber and has a damper for regulating an exhaust amount.

19. The apparatus as set forth in claim 15, wherein said blast unit has a slit damper configured to regulate a flow rate of gas to be supplied into said processing chamber.

* * * * *